United States Patent
Sigal

[19]

[11] Patent Number: 5,910,730
[45] Date of Patent: Jun. 8, 1999

[54] DIGITAL CIRCUIT NOISE MARGIN IMPROVEMENT

[75] Inventor: Leon Jacob Sigal, Monsey, N.Y.

[73] Assignee: International Business Machines Corporation, Armonk, N.Y.

[21] Appl. No.: 08/764,951

[22] Filed: Dec. 13, 1996

[51] Int. Cl.⁶ .................................................. H03K 17/16
[52] U.S. Cl. .............................. 326/24; 326/27; 326/86; 326/90
[58] Field of Search .................................. 326/24, 26, 27, 326/34, 36, 58, 86, 90, 122

[56] References Cited

U.S. PATENT DOCUMENTS

| | | | |
|---|---|---|---|
| 4,103,188 | 7/1978 | Morton | 326/84 |
| 4,656,417 | 4/1987 | Kirkpatrick et al. | 326/16 |
| 4,785,203 | 11/1988 | Nakamura | 326/87 |
| 4,797,579 | 1/1989 | Lewis | 326/27 |
| 4,985,646 | 1/1991 | Kumagai et al. | 326/27 |
| 4,987,324 | 1/1991 | Wong et al. | 326/27 |
| 5,491,432 | 2/1996 | Wong et al. | 326/86 |
| 5,504,983 | 4/1996 | Yoshino | 326/86 |
| 5,532,630 | 7/1996 | Waggoner et al. | 326/21 |
| 5,654,648 | 8/1997 | Medhekar et al. | 326/17 |
| 5,691,655 | 11/1997 | Geisler | 326/86 |

*Primary Examiner*—Michael Tokar
*Assistant Examiner*—Daniel D. Chang
*Attorney, Agent, or Firm*—Louis P. Herzberg; Robert P. Tassinari, Jr.

[57] ABSTRACT

The present invention provides a circuit for increasing the noise tolerance of a receiving gate. This is accomplished by separating the circuit which sets the positive going threshold, from the circuit which sets the negative going threshold. This eliminates the need of making a design compromise equally suitable to both these threshold requirements. It is achieved by separating the logical drive for switching from a low to a high from the logical drive for switching from a high to a low. Alternate embodiments are presented. In one embodiment, separate drivers for PFET and NFET inverter inputs are employed together with an output latch circuit which prevents the output from being in a floating state. In an alternate embodiment the latch is included in-line with the gate output. An implementation of the invention in a two input AND gate is also described.

24 Claims, 20 Drawing Sheets

DIGITAL CIRCUIT NOISE MARGIN IMPROVEMENT

FIELD OF THE INVENTION

The present invention is directed to the field of digital electronic circuits. It is more particularly directed to state transition noise margins.

BACKGROUND OF THE INVENTION

It is a constant endeavor to find ways of increasing the noise margins in digital circuits. This is particularly so because of the continued down scaling of the proximity of circuit interconnecting wires for VLSI circuits. As the proximity is reduced, the crosstalk between adjacent wires becomes a more severe problem.

Crosstalk is largely due to signal radiation from one wire which is subsequently picked-up by its adjacent neighboring wires. These undesired, often high amplitude, and generally transient signals are noise to the circuits driven by the neighboring wires. Often these picked-up signals are high enough to cause false logical transitions which cause performance malfunctions. Pickup is greatest for wires running parallel to the wire that is radiating the signal. General known techniques of minimizing pickup by using shielded wires and/or running wires at right angles to each other are used wherever possible. However, in VLSI circuits, the high circuit densities and corresponding inter connecting wire densities, do not lend themselves to these techniques. Thus a technique is required to reduce or eliminate the false logical transitions.

The pickup problem is illustrated in FIG. 1 for a driver/receiver circuit 100. FIG. 1 shows wire B 110 running between and adjacent to wire A 108 and wire C 112. Wire B 110 interconnects the output 118 of a driver circuit 104 with the input 124 of a receiving gate 116. Consider the case in which the output 118 of the driver 104 is held at a logical low, '0' or ground. When wire A 108 and/or wire C 112 carry a signal that is switching from a low to a high, waveform 152 and/or waveform 154, wire B 110 picks up a positive going signal transition spike, waveform 156, at the input node 124 of the receiving gate 116. The level of the picked up positive going signal 156 is dependent upon the finite resistance of wire B 110 and the amount of capacitance and inductance coupling wire B 110 has with its adjacent wires carrying a positive going signal. If this picked-up positive going signal 156 has an amplitude sufficient to trigger the receiver 116 to change its logical state, it causes a circuit malfunction. The level that is just sufficient to trigger the receiver 116 is herein referred to as the receiver's 116 positive going threshold. The positive going threshold is defined as the minimum input voltage level that is recognized by the receiver gate as a logical high that causes the receiver gate to switch its output logical state. A high input positive threshold level makes the receiver gate 116 more tolerant to positive going noise. This reduces the possibility of the gate being triggered by noise when its input is at a low.

A similar situation exists in the case in which the output 118 of driver 104 is held at a logical high, '1' or VDD. When wire A 108 and/or wire C 112 carry a signal switching from a high to a low, waveform 162 and/or waveform 164, wire B 110 picks up a negative going signal transition spike waveform 166 at the input node 124 of the receiver 116. The level of the picked up negative going signal 166 is dependent upon the finite resistance of wire B 110, and the amount of capacitive and inductive coupling wire B 110 has with its adjacent wire carrying a negative going signal. If this picked-up negative going signal 166 is of sufficient amplitude to trigger the receiver 116 to change its logical state, it causes a circuit malfunction. The level that is just sufficient to trigger the receiver 116 is herein referred to as the receiver's 116 negative going threshold. The negative going threshold is defined as the maximum input voltage level that is recognized by the receiver gate as a logical low causing the receiver gate to switch its output logical state. A high input negative threshold level makes the receiver gate 116 more tolerant to negative going noise, thereby reducing the possibility of false triggering when its input is at a high.

Generally, a compromise is made in selecting a noise threshold for both the low to high and the high to low transitions. Thus, the threshold is set at an intermediate level to equally satisfy both transition directions. In FET technologies where the low and high levels are at or near the opposite power rails, the most noise tolerant receiver is one that has a threshold of VDD/2. This is achieved by choosing PFET and NFET that have equal strength. FET strength is controlled by the FET's width/length ratio. With a threshold of VDD/2, the receiving gate of FIG. 1 has a noise tolerance of VDD/2.

In order to take full advantage of technology scaling, wires must be spaced very close to each other. This spacing leads to a situation where noise pickup is higher than VDD/2, causing circuit malfunction. Avoiding this by increasing the spacing between wires, reduces the useable wire density which results in increased chip size and cost. A method is required to reduce the effect of noise on circuit performance, even though the circuit wires run in very close proximity. The present invention describes a receiving gate circuit that has an increased tolerance to noise. This allows wires to be spaced closely together without causing any logic circuits to malfunction.

SUMMARY OF THE INVENTION

It is an object of the present invention to provide a digital circuit having a circuit input for accepting a logical signal. The circuit comprises: a first logic gate having a low input threshold, a first gate output, and a first gate input coupled to the circuit input; a second logic gate having a high input threshold, a second gate output, and a second gate input coupled to the circuit input; and a driver having a first driver input, a second driver input and a driver output. The first driver input is coupled to the first gate output, and the second driver input is coupled to the second gate output. The driver comprises a first pair of complementary transistors connected between a pair of power rails so as to commonly form the driver output.

In one embodiment, the first logic gate comprises a second pair of complementary transistors forming a first inverter, and the second logic gate comprises a third pair of complementary transistors forming a second inverter, and/or the first pair of complementary transistors includes a PFET and an NFET, in which the first driver input is an input of the NFET and the second driver input is an input of the PFET.

In an embodiment, the digital circuit further includes a latch circuit having a latch input and a latch output, both coupled to the driver output for maintaining current flow in the driver. Often the driver comprises a first pair of complementary transistors, and the latch circuit comprises a second pair of complementary transistors having a first common input forming the latch input and a first common output, and also a third pair of complementary transistor having a second common input coupled to the first common output, a second common output forming the latch output. The third pair of complementary transistors is formed to be weaker than the first pair of complementary transistors.

In an alternate embodiment, the driver comprises a first pair of complementary transistors, and the digital circuit further includes a current buffer coupled in-line with the driver output and comprises: a second pair of complementary transistors forming an inverter having a first common input coupled to said driver output, and a first common output; and a third pair of complementary transistors having a second common input coupled to the first common output, and a second common output coupled to the first common input to provide feedback, wherein the third pair of complementary transistors is weaker than the first pair of complementary transistors.

Another aspect of the present invention is to provide a digital circuit having a circuit input for accepting a logical signal which comprises: a first logic gate having a low input threshold, a first gate output, and a first gate input coupled to the circuit input; a second logic gate having a high input threshold, a second gate output, and a second gate input coupled to the circuit input; a third logic gate having a high input threshold, a third gate input coupled to the first gate output, and a third gate output; a fourth logic gate having a low input threshold, a fourth gate input coupled to the second gate output, and a fourth gate output; and a driver having a first driver input, a second driver input and a driver output. The first driver input is coupled to the third gate output, the second driver input is coupled to the fourth gate output, and the driver comprises a complementary pair of transistors connected between a pair of power rails and so as to commonly form the driver output.

In a particular embodiment, the digital circuit includes a current buffer comprising a complementary pair of strong transistors at least one of which is in an active state. The current buffer is coupled in-line with the driver output.

Still, another aspect of the present invention is to provide a digital circuit comprising: a circuit input for accepting a logical signal, and having a circuit output; a first inverter gate having a first gate input coupled to the circuit input, a first gate output, and a high 'noise-margin-high'; a second inverter gate having a second gate input coupled to the circuit input, a second gate output, and a high 'noise-margin-low'; a dual input inverter gate having a third input coupled to the first output, a fourth input coupled to the second output, and an inverter output which forms the circuit output.

In some embodiments, the digital circuit comprises bipolar transistors. Alternate embodiments are comprised of a combination of CMOS and bipolar transistors.

A further aspect of the present invention is to provide a method to increase the noise margin of a digital circuit having a circuit input for accepting a logical signal. The method comprising the steps of: providing a first logic gate having a low input threshold, and a first gate output; coupling the first gate input to the circuit input; providing a second logic gate having a high input threshold, and a second gate output; coupling the second gate input to the circuit input; providing a driver having a first driver input, and a second driver input; coupling the first driver input to the first gate output; and coupling the second driver input to the second gate output. In one embodiment, the method further comprises the steps of forming the first logic gate into a first inverter, and forming the second logic gate into a second inverter, and/or the step of forming a common driver output for the driver using a first pair of complementary transistors connected between a pair of power rails. In an embodiment of the method the first pair of complementary transistors includes a PFET and an NFET, the first driver input is an input of the NFET, and the second driver input is an input of the PFET.

In another embodiment the method further comprises the steps of providing a latch circuit having a latch input and a latch output, and coupling the latch input and the latch output to the driver output for maintaining current flow in the driver, and/or includes the steps of: forming the driver from a first pair of complementary transistors; forming the latch circuit from a second pair of complementary transistors having a first common input forming the latch input, a first common output, and a third pair of complementary transistor having a second common input coupled to the first common output, and a second common output forming the latch output; and forming the third pair of complementary transistors to be weaker than the first pair of complementary transistors.

Still, another aspect of the present invention is to provide a method for increasing the noise margin of a digital circuit having a circuit input for accepting a logical signal. The method comprises the steps of:

providing a first logic gate having a low input threshold, and a first gate input; coupling the first gate input to the circuit input; providing a second logic gate having a higher input threshold, a second gate output, and a second gate input; coupling the second gate input to the circuit input; providing a third logic gate having a third gate input and a third gate output; coupling the third gate input to the first gate output, providing a fourth logic gate having a fourth gate input and a fourth gate output; coupling the fourth gate input to the second gate output; providing a driver having a first driver input, a second driver input, and a driver output; coupling the first driver input to the third gate output, and the second driver input to the fourth gate output; and forming the driver from a complementary pair of transistors connected between a pair of power rails so as to commonly form the driver output. In an embodiment the method also includes the steps of providing a current buffer comprising a complementary pair of strong transistors at least one of which is in an active state, and coupling the current buffer in-line with the driver output.

Another aspect of the present invention is to provide a method for separately setting the noise margin of a digital circuit for an input transition from a low to a high, and the noise margin for an input transition from a high to a low. The method comprises the steps of: providing a circuit input for accepting a logical signal and having a circuit output; providing a first inverter gate having a first gate input, a first gate output and a low threshold forming a high 'noise-margin-high'; coupling the first gate input to the circuit input; providing a second inverter gate having a second gate input to the circuit input, a second gate output and a high 'noise-margin-low'; coupling the second gate input to the circuit input; providing a two input inverter gate having a third gate input, a fourth gate input, and forming the circuit output; coupling the third gate input to the first output, and the fourth gate input to the second output.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

The present invention provides a means and circuit for increasing the noise tolerance of a receiving gate. This is accomplished by separating the circuit which sets the positive going threshold, from the circuit which sets the negative going threshold. This eliminates the need of making a design compromise equally suitable to both these threshold requirements. In accordance with the present invention, this is achieved by separating the logical drive for switching from a low to a high from the logical drive for switching from a high to a low.

Figure 1A:
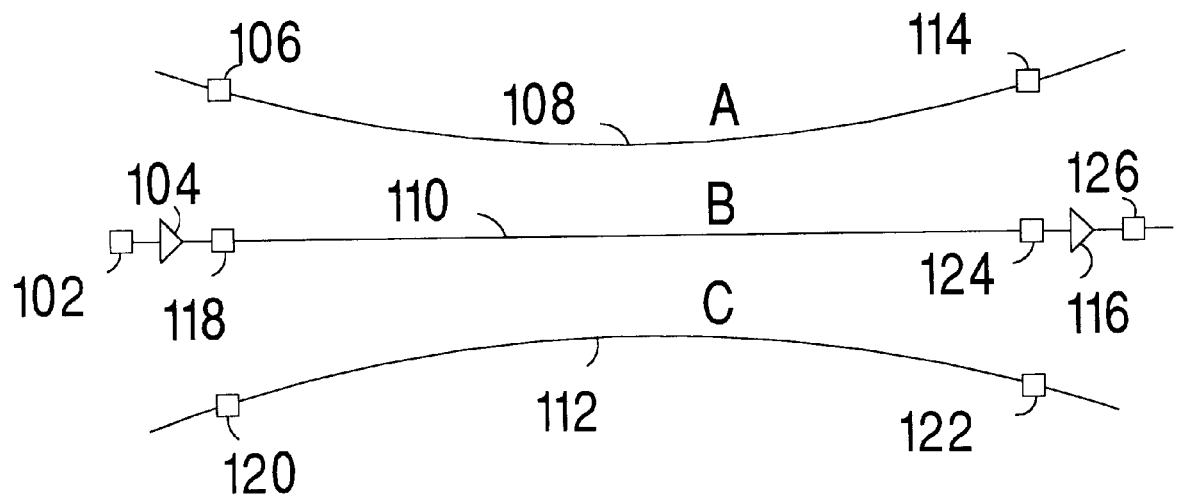
FIGS. 1(a)–(c) shows the pickup problem for a driver/receiver circuit.
Figure 1B:
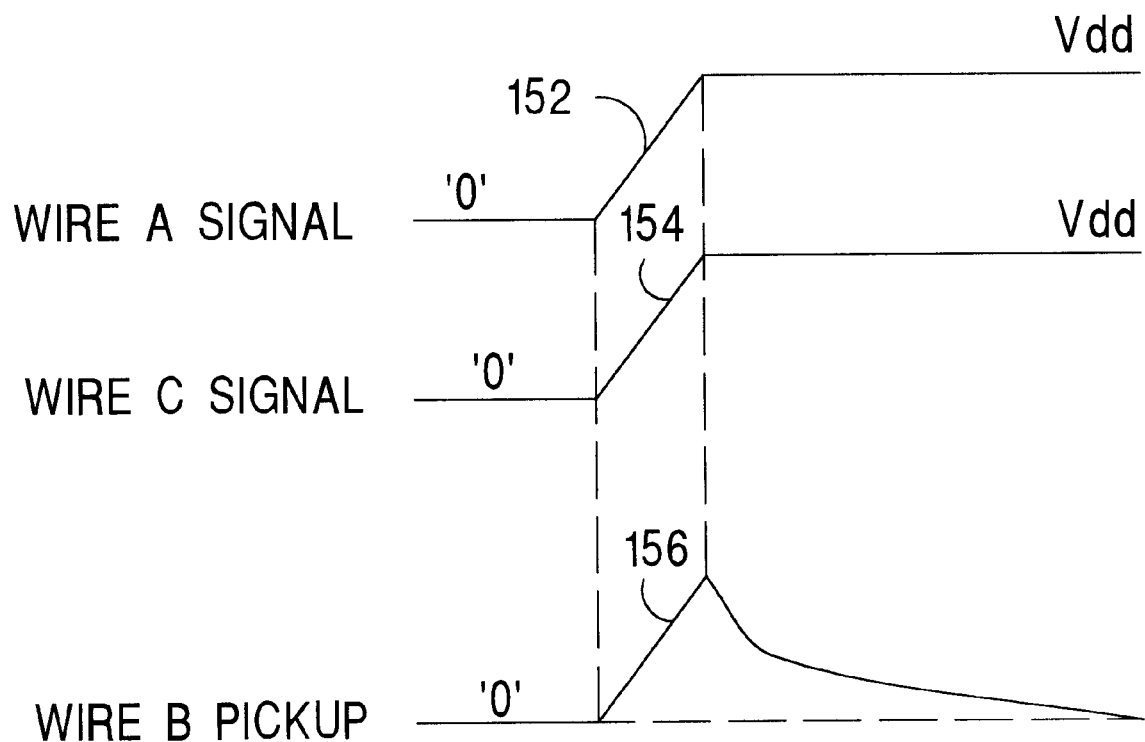
Figure 1C:
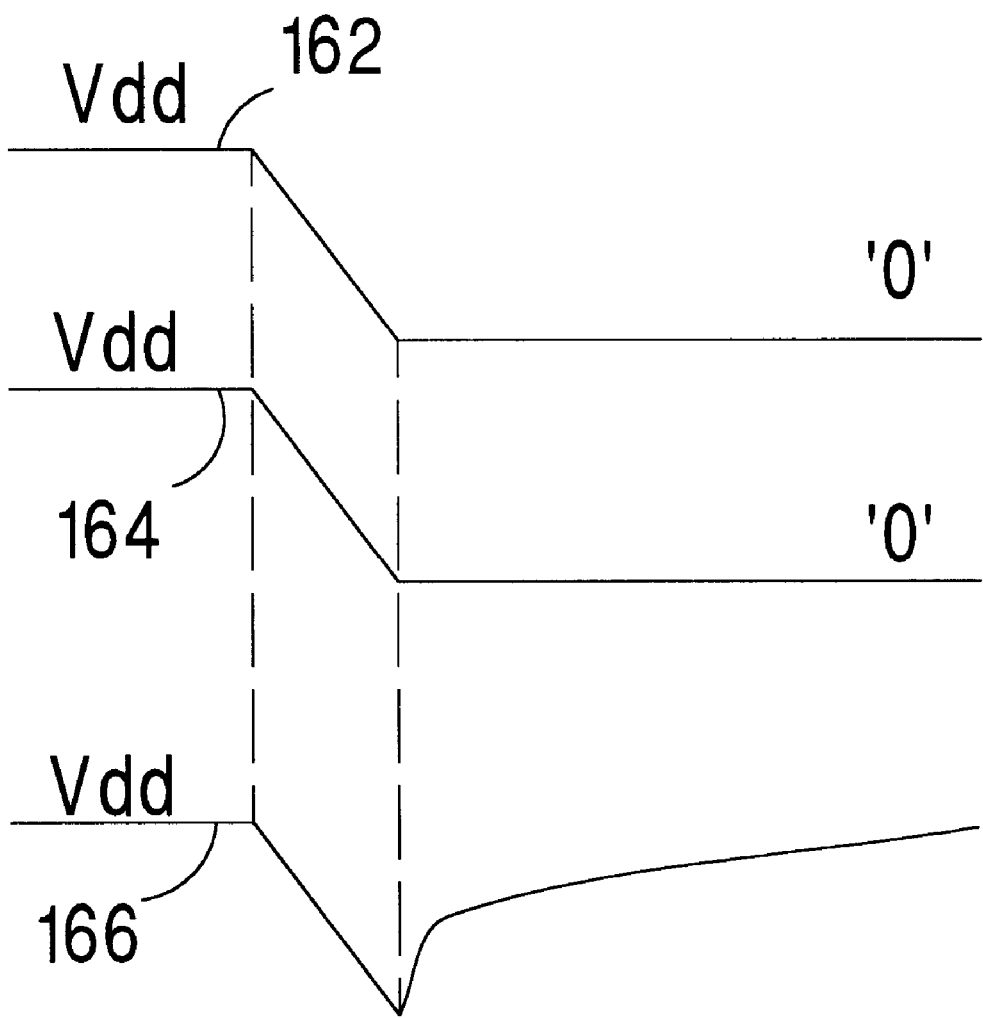
Figure 2A:
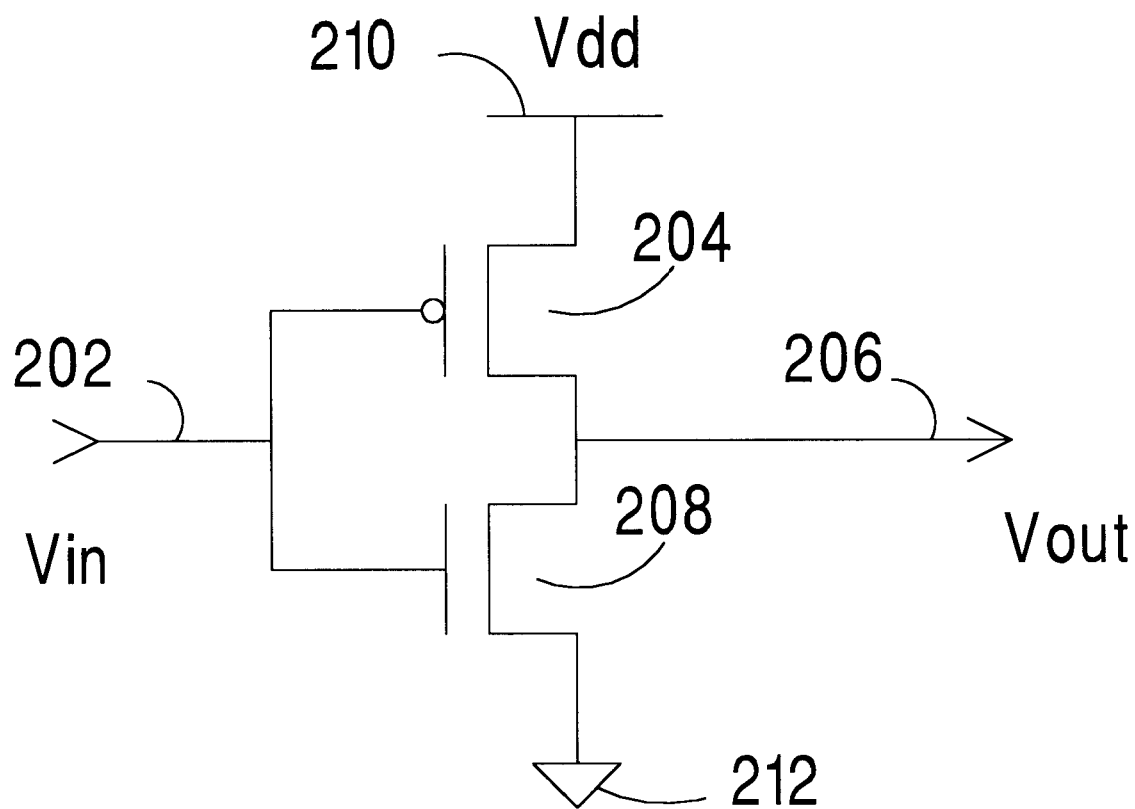
FIG. 2(a) shows a standard field effect transistor logic inverter.
Figure 2B:
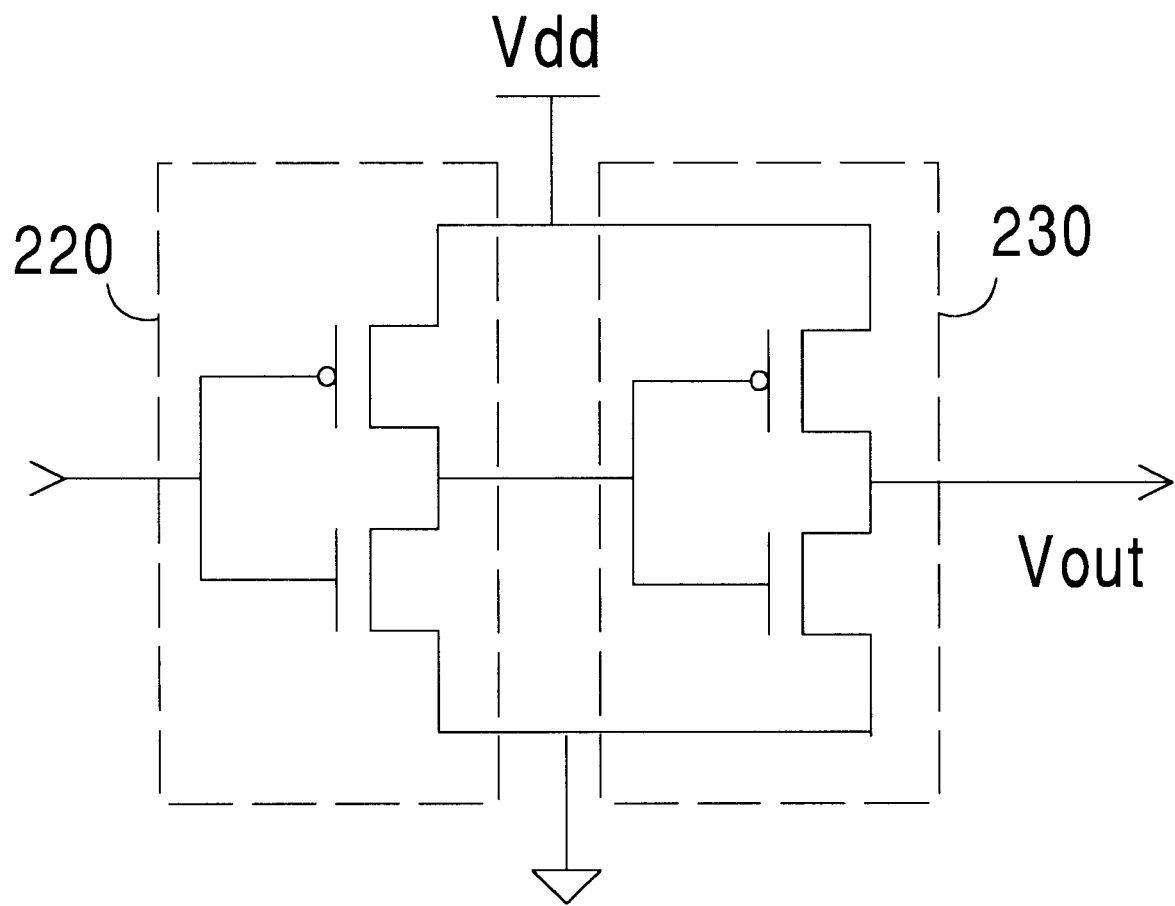
FIG. 2(b) shows a standard field effect transistor logic non-inverting buffer formed by combining shown in two inverters shown in FIG. 2(a).

FIG. 2(a) shows a standard FET, field effect transistor, logic inverter. It consists of a PFET 204 and an NFET 208 connected in a common drain configuration between the positive power rail 210, VDD and the negative power rail 212, ground. The gate inputs of both transistors are tied together to form the inverter input 202. The signal at the output 206 is the logical complement of the signal at the input 202. A non-inverting buffer is generally formed by combining two such inverters 220 230 as shown in FIG. 2(b).

Figure 3:
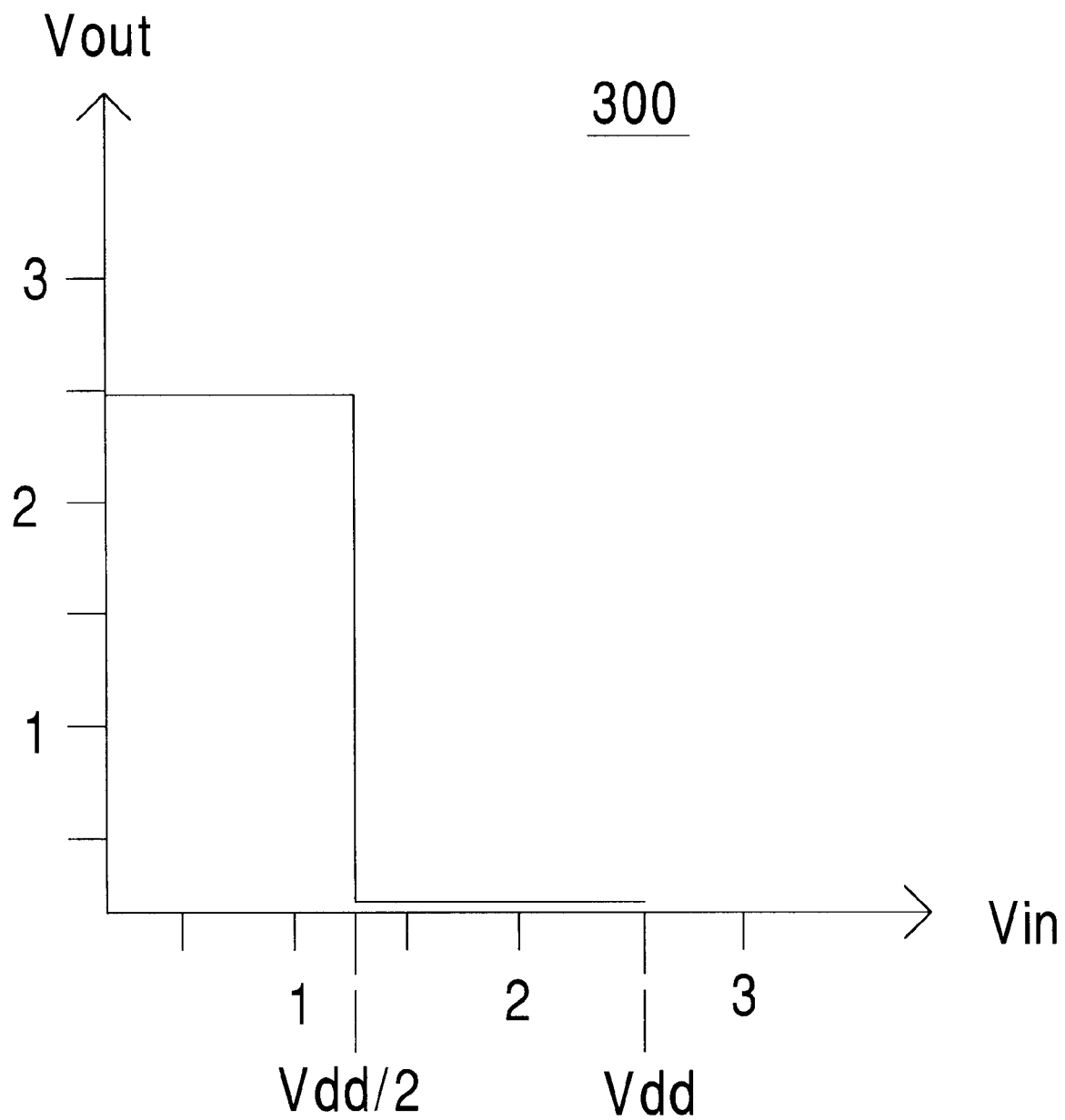
FIG. 3 shows the transition transfer curve for an ideal FET inverter.

In the prior art the PFET and NFET are designed to achieve a switching threshold of VDD/2. The transition transfer curve 300 for an ideal FET inverter is shown in FIG. 3. It shows Vout versus Vin for Vin ranging from zero (ground) to a VDD of 2.5 volts. Referring to both FIGS. 2 and 3, it shows that as long as the signal level Vin at the input 202 is below VDD/2, the PFET 204 is in its 'ON' state and the NFET 208 is in its 'OFF' state. Under these conditions the level Vout at the output 206 is at or near VDD. When the signal level Vin at the input 202 is above VDD/2, the PFET 204 is in its 'OFF' state and the NFET 208 is in its 'ON' state. Under these conditions the level Vout at the output 206 is at or near ground. This is the case since both the positive and negative going thresholds are designed to be VDD/2.

Figure 4A:
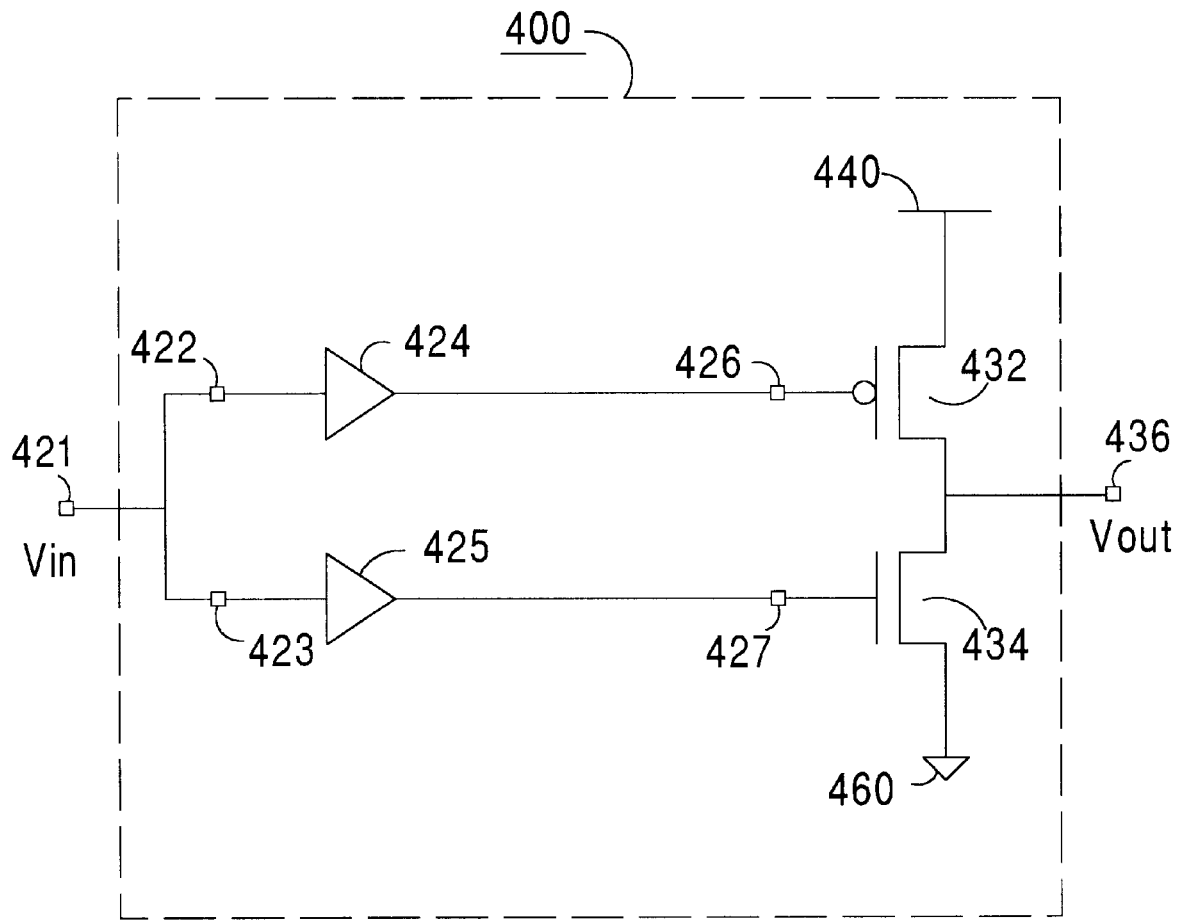
FIG. 4(a) shows an embodiment of a receiving gate in accordance with the present invention.

The present invention separates the design for the positive going threshold, from the design for the negative going threshold. In one embodiment this is accomplished by using separate drivers for the PFET and NFET inverter inputs. An embodiment of a receiving gate 400 in accordance with the present invention is shown in FIG. 4(a). FIG. 4(a) shows the gate node 426 of the PFET 432 driven by an upper driver 424 and the gate node 427 of the NFET 434 driven by a lower driver 425. Since the invention may be implemented using different circuit configurations, each driver is shown in block diagram form rather than with a particular circuit component configuration. The input 422 of the upper driver 424 is tied together with the input 423 of the second driver to form the common receiving gate input 421. In this configuration the upper driver 424 is designed to have a high threshold, say ¾ VDD, whereas the lower driver 425 is designed to have a low threshold, say ¼ VDD. This corresponds to making the receiving gate to have an ideal noise tolerance, or noise margin, of ¾ VDD in both transition directions. In this embodiment, when the receiving gate 400 output 436 has a logical low, it is held to the low as long as the receiving gate input 421 has a signal less than ¾ VDD. When the receiving gate output 436 is at a logical high, it is held to the high as long as the receiving gate input 421 has a signal level higher than ¼ VDD.

Figure 4B:
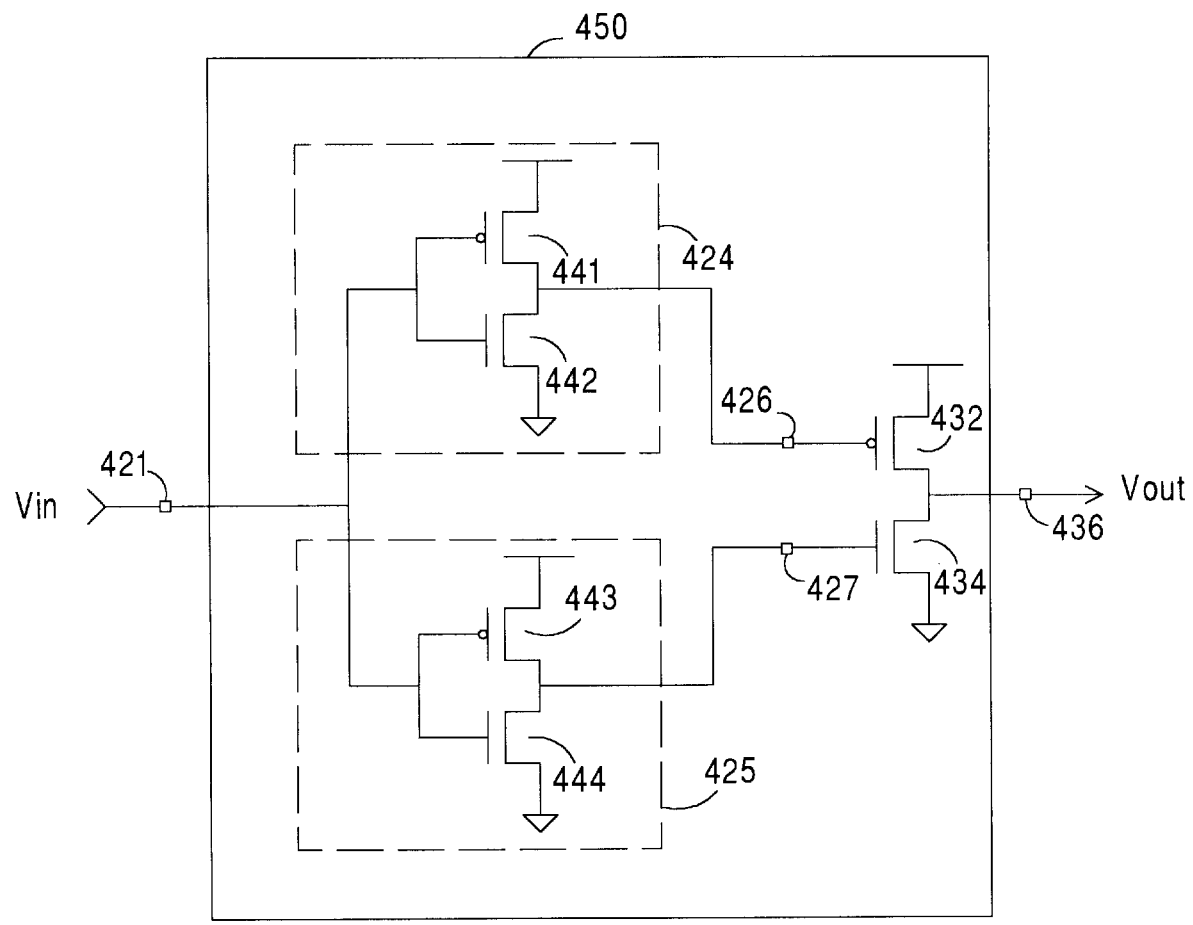
FIG. 4(b) shows an embodiment of the present invention using a receiving gate circuit configuration in which each driver is an inverter of the type shown in FIG. 3.
Figure 4C:
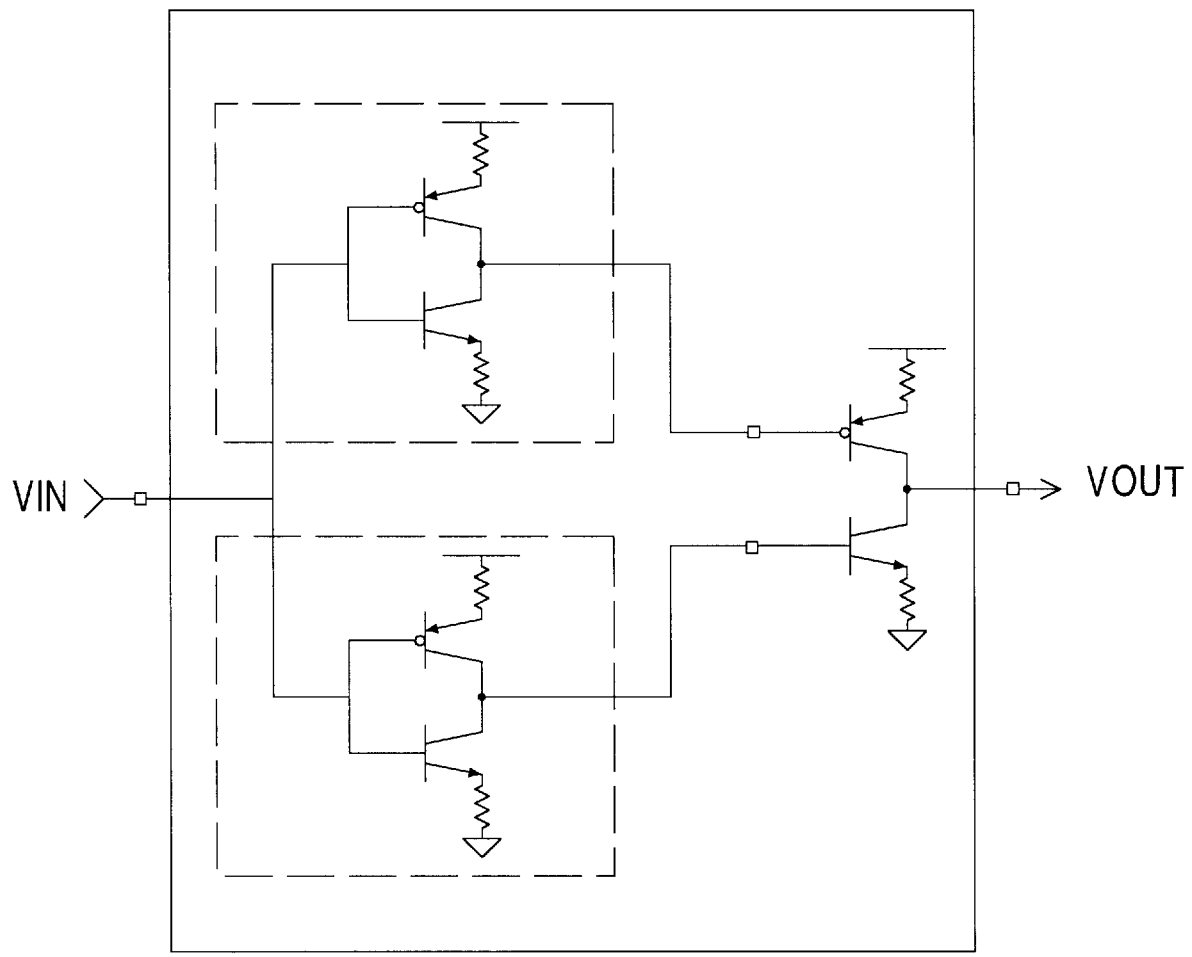
FIG. 4(c) shows a bipolar circuit implementation of the circuit of FIG. 4(b)
Figure 5:
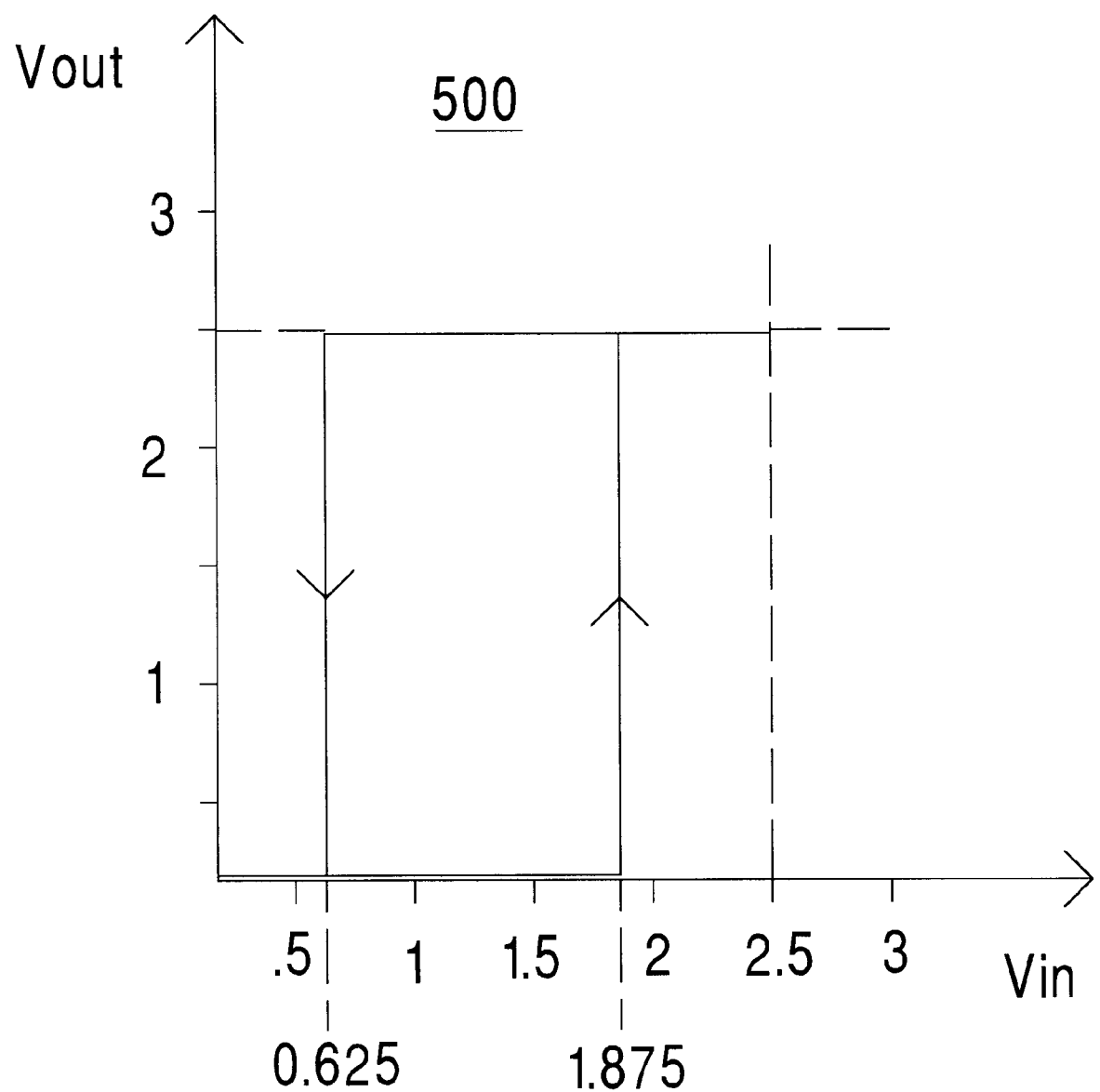
FIG. 5 shows the ideal transition transfer function for the receiving gate of FIG. 4(b) designed in accordance with the present invention.

An embodiment of the present invention using a receiving gate 450 circuit configuration in which each driver 424–425 is an inverter of the type shown in FIG. 2(a), is shown in FIG. 4(b). FIG. 5 shows the ideal transition transfer function 500 for the receiving gate 450 of FIG. 4(b) designed in accordance with the present invention. The design is shown for a case wherein VDD=2.5 volts, the positive going threshold is set to ¾ VDD=1.875 volts, and the negative going threshold is set at ¼ VDD=0.625 volts. The receiving gate performs the function of a receiving buffer and does not perform logical inversion. When employing FET technology the circuit threshold is set by the physical length and width of the transistor. FIG. 4(c) shows a bipolar circuit implementation of the circuit of FIG. 4(b).

The following definitions are used herein for the parameters of a logic gate with inversion:

Voh—lowest output voltage that is considered to be a logic high, '1'. This is assumed to be at 90% of VDD.

Vol—highest output voltage that is considered to be logic low, '0'. This is assumed to be 10% of VDD.

Vih—lowest input voltage that produces a valid logic low, '0'.

Vil—highest input voltage that produces a valid logic high, '1'.

NMH—'noise-margin-high'=Voh−Vih.

NML—'noise-margin-low'=Vil−Vol.

Figure 6:
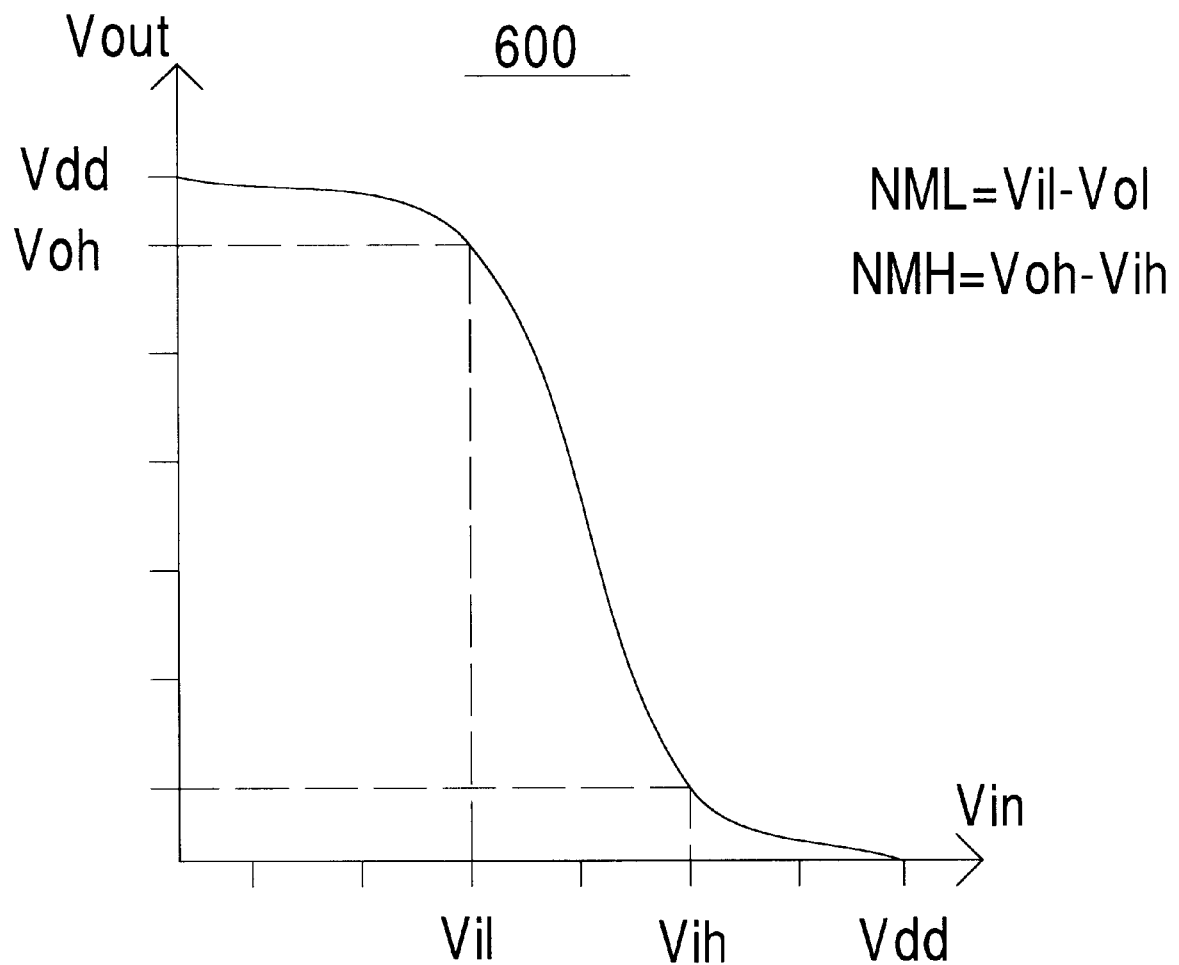
FIG. 6 shows a transfer curve of a CMOS FET inverter using the configuration of FIG. 2.

FIG. 6 shows a transfer curve using these definitions. It shows an actual transfer curve 600 of a CMOS FET inverter using the configuration of FIG. 2. The circuit of FIG. 2 functions as follows: When Vin 202 is at GND, NFET 208 is not conducting current and PFET 204 is conducting current. This drives Vout 206 high, to VDD 210. As Vin 202 increases from GND to VDD, NFET 208 begins to conduct more and more current, while PFET 204 is conducting less and less current. The inverter output voltage, Vout 206, begins to drop from VDD 210 towards GND 212. When Vin 202 reaches VDD, the NFET 208 is conducting current and PFET 208 is not conducting current. This drives Vout 206 to GND. The actual threshold level of an inverter is dependent upon its transistors' physical length and width.

Figure 7:
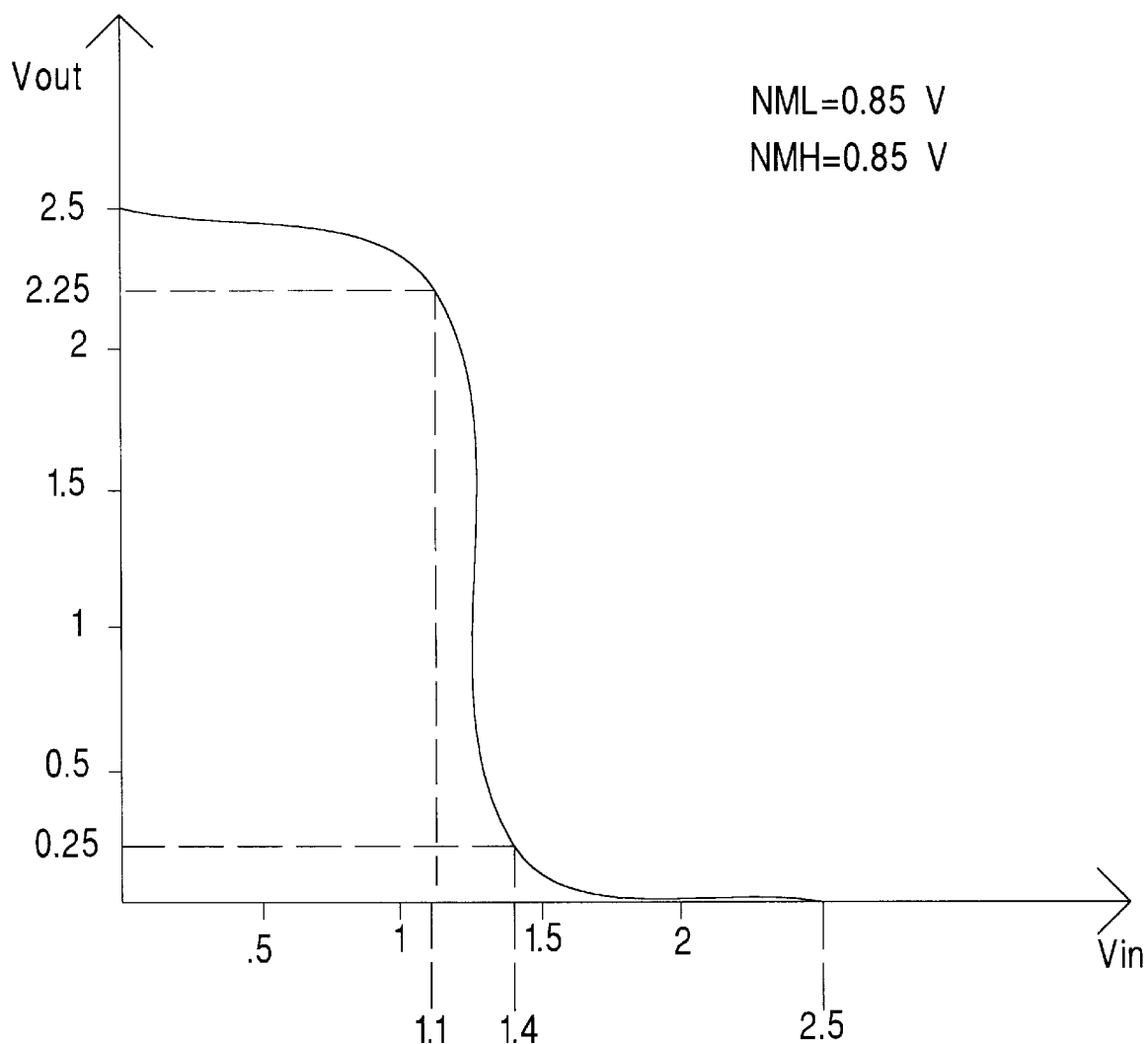
FIG. 7 shows an example of a balanced inverter that produces equal noise immunity, for both logic '1' and logic '0' inverter states, for the circuit of FIG. 2.

FIG. 7 shows an example of the transfer characteristics of an inverter in IBM's CMOS5X technology that produces equal noise immunity for both logic '1' and logic '0' states for the circuit of FIG. 2. The PFET 204 is formed to have a width of 28 um, and the NFET 208 is formed to have a width of 10 um. Both transistors have effective lengths of 0.25 um. These transistor widths and lengths yield a PFET:NFET width/length ratio of 2.8:1. With these parameters both the 'noise-margin-low', NML, and the 'noise-margin-high' NMH are 0.85 V. An inverter, with the transfer characteristics as that shown in FIG. 7, is herein said to be a balanced inverter and to have a balanced threshold. In this case its 'noise-margin-low', NML, is equal to its 'noise-margin-high', NMH.

Figure 8:
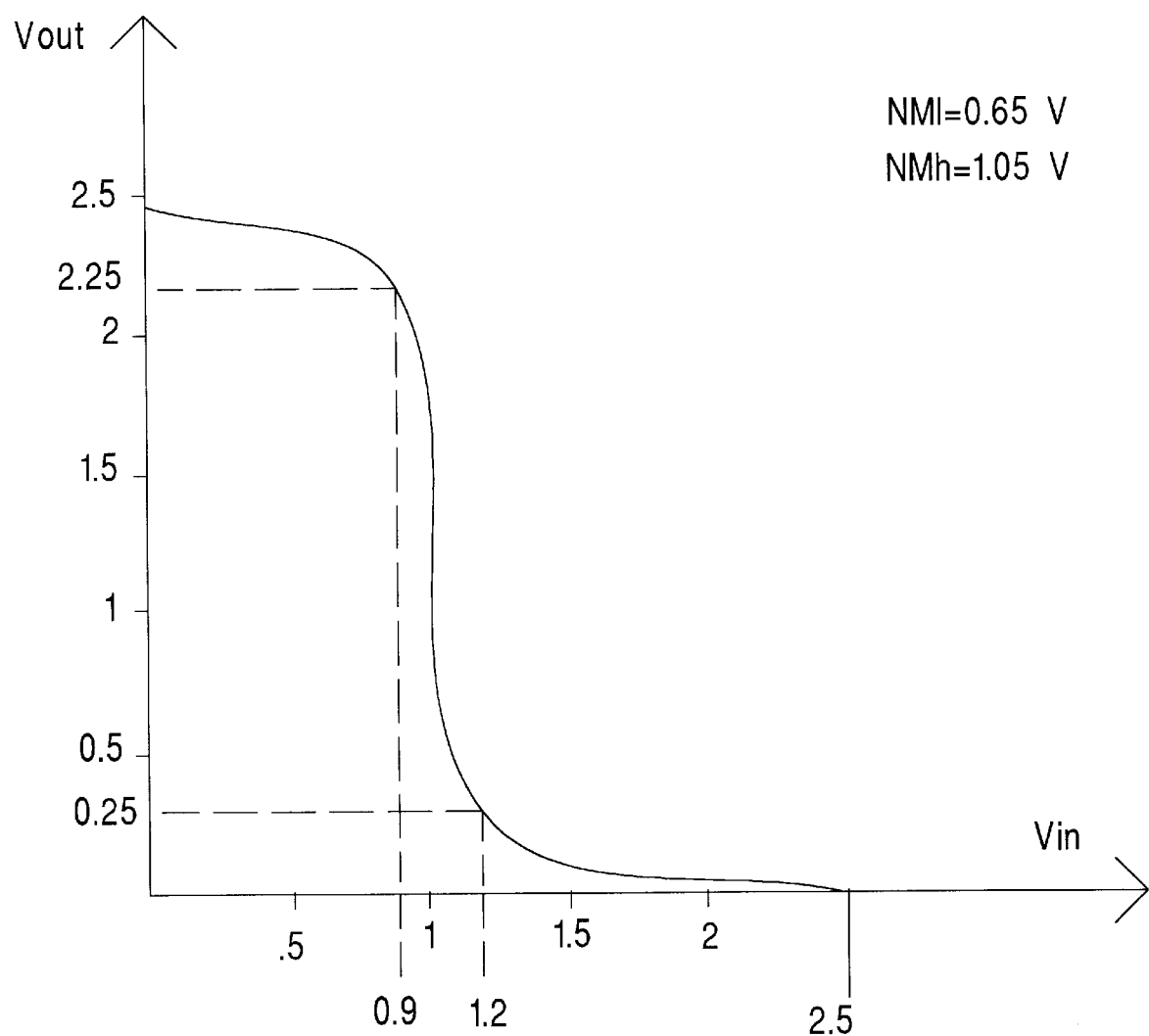
FIG. 8 shows a typical transfer curve for a PFET-width to NFET-width ratio of 1.4:1.

An inverter is herein said to have a low input threshold, if it has a transfer curve shifted to the left of the transfer curve of the balanced threshold inverter. In this case its 'noise-margin-low', NML, is less than its 'noise-margin-high', NMH. Its 'noise-margin-high', NMH, is higher than the NMH of the balanced inverter, and its NML is lower than the NML of the balanced inverter. A transfer curve for an inverter having a low input threshold is shown in FIG. 8.

Figure 9:
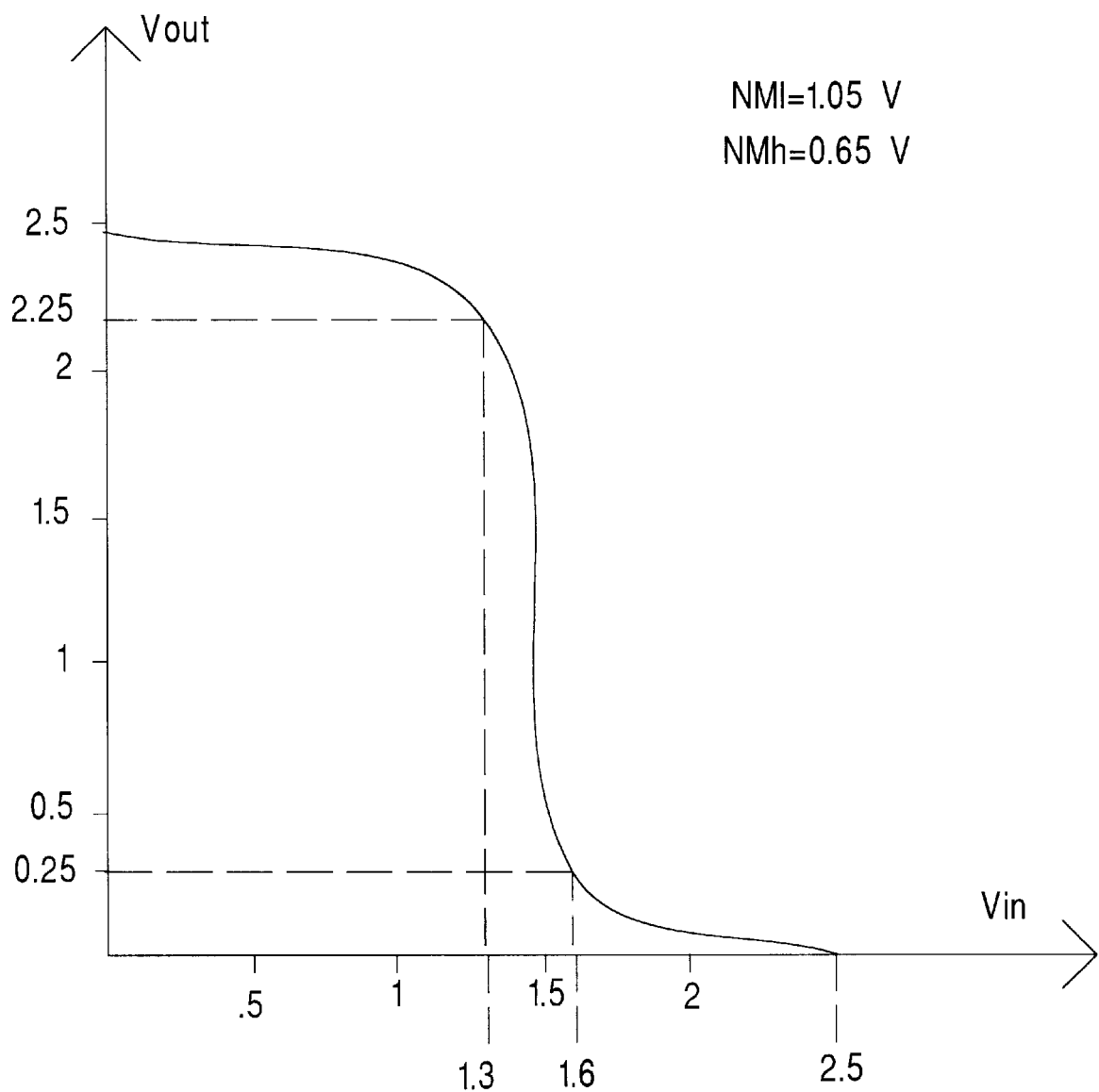
FIG. 9 shows a typical inverter transfer curve for a PFET-width to NFET-width ratio of 5.6:1 in accordance with the present invention.

An inverter is herein said to have a high input threshold, if it has a transfer curve shifted to the right of the transfer curve of the balanced threshold inverter. In this case its 'noise-margin-low', NML, is higher than its 'noise-margin-high', NMH. Its NMH is lower than the NMH of the balanced inverter. Its NML is higher than the NML of the balanced inverter. A transfer curve for an inverter having a high input threshold is shown in FIG. 9.

In CMOS technology, a typical logical gate is formed in the form of an inverter. A non-inverting gate is typically formed by coupling two inverters together. The transition transfer curve of a non-inverting gate is formed by combining two of the curves shown in FIG. 7.

The following is a method for implementing the embodiment shown in FIG. 4(b). Referring to FIG. 4(b), driver 425 is designed to have a high negative going threshold. This produces an increase in the high noise margin, NMH. This is accomplished by reducing the PFET:NFET width ratio. FIG. 8 shows a typical transfer curve resulting from a PFET-width to NFET-width ratio of 1.4:1. This is obtained for example if the PFET is designed to have a width of 28 um, whereas the NFET is designed to have a width of 20 um. With this configuration, driver 425 has a low noise margin, NML, of 0.65 volts, and a high noise margin, NMH, of 1.05 volts. This is an increase in NMH of 0.2 volts over the NMH=0.85 volts for the prior art design of FIG. 2.

Drive 424 is designed to have a high positive going threshold to produce an increase in the 'noise-margin-low', NML. This is accomplished by increasing the ratio of its PFET-width to NFET-width, PFET:NFET. FIG. 9 shows a typical inverter transfer curve resulting from a PFET-width to NFET-width ratio of 5.6:1. This results when the PFET-width is held at 28 um, whereas the NFET-width is decreased to 5 um. With this configuration, driver 424 has a low noise margin, NML of 1.05 volts, and a 'noise-margin-high' of 0.65 volts. This again is an increase in NML of 0.2 volts over the NML=0.85 for the prior art design of FIG. 2.

Figure 10:
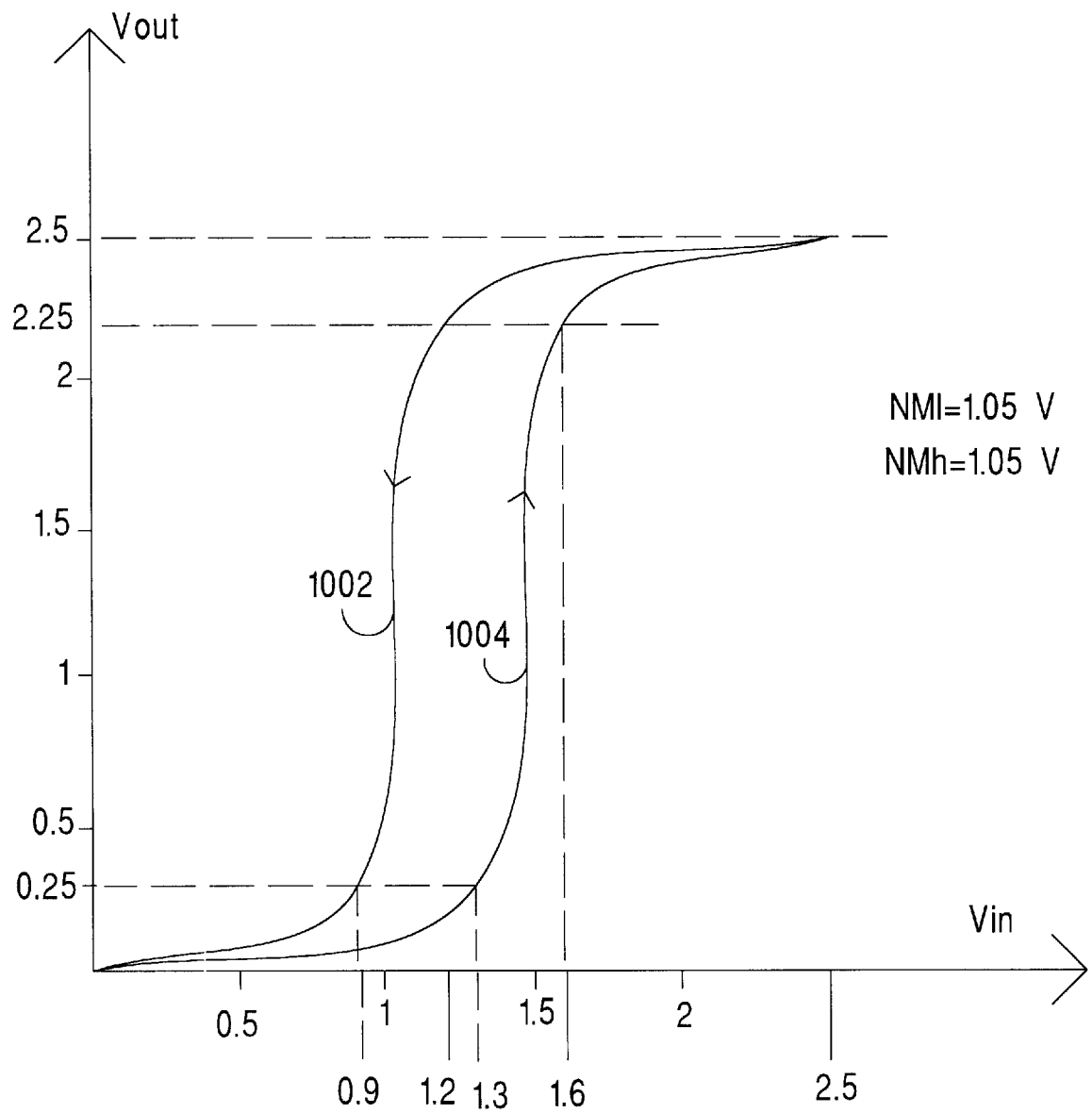
FIG. 10 shows the overall receiver gate transfer curve in accordance with the present invention.

Using the transistor physical width resulting in the transfer curves of FIGS. 8 and 9 for drivers 425 and 424 respectively, results in the overall receiver gate transfer curve shown in FIG. 10. Referring to both FIG. 4(b) and FIG. 10 it is noted that the two stage receiving gate receives and buffers its input signal, Vin 421, with a double inversion to form its output signal, Vout 436. FIG. 10 shows that when the receiving gate output is at a logical low, Vout 436 follows Vin 421 in accordance with waveform 1004. This results in a 'noise-margin-low', NML, of 1.05 volts for the receiving gate 450. When the receiving output is at a logical high, Vout 436 follows Vin 421 in accordance with waveform 1002. This gives the receiving gate 450 a 'noise-margin-low', NMH, of 1.05 volts. It is noted that the reduction of NML of driver 425, and the reduction of NMH of driver 424 to 0.65 volts has no performance consequence to the functioning of the receiving gate 450. This is in consequence of the present invention in which since each driver is only activated in one transition state. Driver 424 is only active during a low to high Vin transition, whereas driver 425 is only active during a high to low Vin transition. In the case that signal Vin 421 is at GND (logic 0), and is switching to VDD. When Vin 421 reaches 0.9 Volts, Lower driver 425 begins to drive its output node 427 low and transistor NFET1 434 begins to turn off. When Vin 421 reaches 1.3 V, upper driver 424 begins to drive its output node 426 low, and transistor PFET1 432 begins to turn on so as to drive node Vout 436 high. As long as Vin 421 is below 1.3 Volts, the receiving gate does not switch. Therefore, any GND noise which is less than the NML of upper driver 424 does not cause the receiving gate to change states.

Similarly, when signal Vin 421 is at VDD, logic high '1', Vout 436 is at a high '1'. When Vin 421 is reduced 1.6 V, upper driver 424 begins to drive its output node 426 high, and transistor PFET1 432 begins to turn off. When Vin 421 reaches 1.2 Volts, Lower driver 425 begins to drive its output node A high, and transistor NFET1 434 begins to turn on so as to drive node Vout 436 low. As long as Vin 421 is above 1.2 Volts, the receiving gate does not switch. Therefore, any VDD noise which is less then the NMH of Lower driver 425 would not cause the receiving gate to change states.

In FIG. 7 the noise immunity of the receiving gate is 0.85 V. In the circuit of FIG. 4(b), the noise immunity of the receiving gate is 1.05 V. Thus the receiving gate of FIG. 4(b) can tolerate more wire crosstalk and therefore have finer wire-to-wire pitch. This allows an increase in wire density and a decrease in chip size and cost.

In what follows, a transistor or a transistor's drive, is herein referred to as being weak if its 'ON' saturation current is relatively low in comparison to the 'ON' saturation current of another transistor or transistor's drive. A transistor is herein referred to as being strong, if its 'ON'saturation current is relatively high in comparison to the 'ON' saturation current of another transistor or transistor's drive. Thus, the terms weak and strong are used when relating one transistor, or transistor's drive, to another transistor or transistor's drive. A weak transistor has a lower saturation current than a strong transistor.

Figure 11:
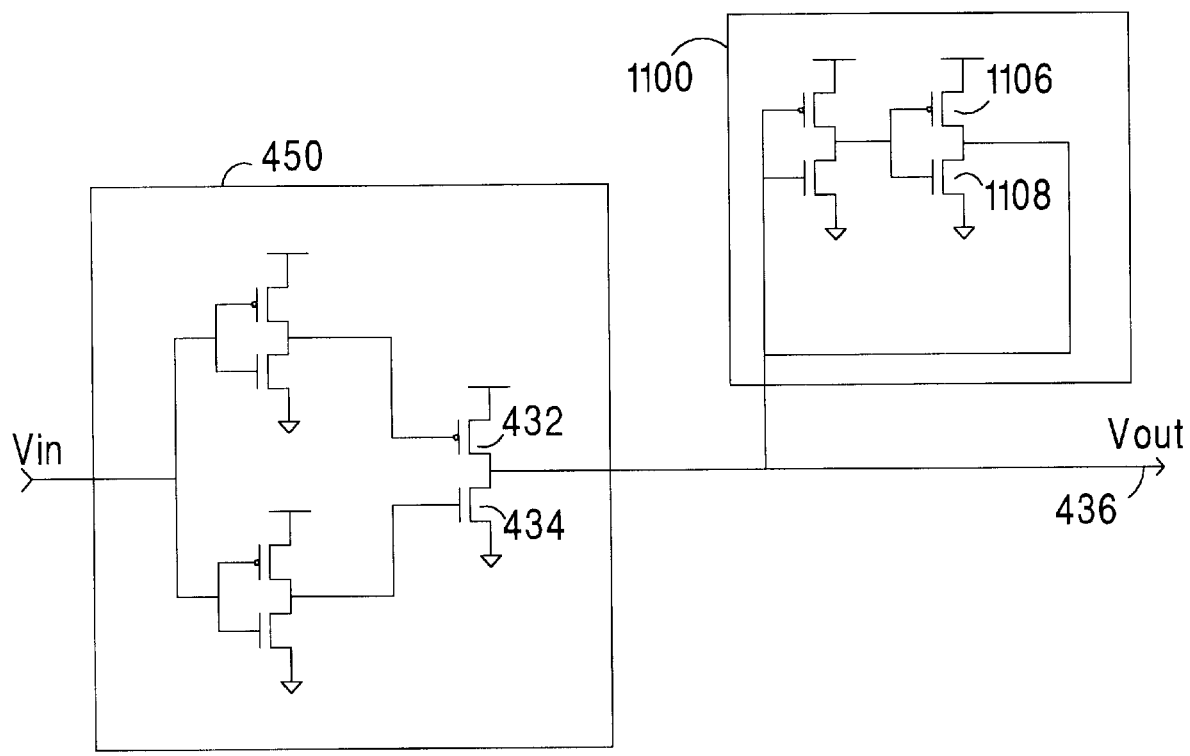
FIG. 11 shows a circuit with a latching circuit added onto Vout of the receiving gate in accordance with the present invention.

Several enhancements can be made to the circuit of FIG. 4(b). It is noted that for the circuit of FIG. 4(b) there is a region of Vin 421 between 0.9 Volts and 1.6 V when both NFET1 434 and PFET1 432 are not driving the output node Vout 436. Thus, Vout 436 is floating. This makes the output, Vout 436, susceptible to coupling noise from wires adjacent to it. In a receiver of FIG. 2 the transition region is only between 1.1 Volts and 1.4 V as shown in FIGS. 6 and 7. It is advantageous to hold Vout 436 at its desired level so that it does not float. This may be accomplished by adding a latching circuit 1100 onto Vout 436 of receiving gate 450, as shown in FIG. 11. Latching circuit 1100 maintains the logical value of node Vout 436 even though both NFET1 434 and PFET1 432 are not actively driving it. In one embodiment, transistor PFET1 432, which tries to drive node Vout 436 high is designed in such a way that it overpowers transistor NFET2 1108 which tries to keep node Vout 436 low. For example, designing the PFET1:NFET2 width/length ratio to be 28:1, gives PFET1 432 ten times the conducting current of NFET2 1108. This is sufficient to hold Vout 436 at a logical high '1'. Similarly, transistor NFET1 434 which tries to drive node Vout 436 low, is designed in such a way that it overpowers transistor PFET2 1106 which tries to keep node Vout 436 high. This is achieved by designing the NFET1:PFET2 to have a width/length ratio of 10:2.8. This gives the NFET1 434 10 times the conducting current of the PFET2 1106, which is sufficient to hold output Vout 436 at a logical low, '0'.

It is noted that although the circuit of FIG. 11 is an improvement over the circuit of FIGS. 4(a) and 4(b) in that it provides a continuous drive to the output Vout 436. The drive is from a relatively weak latch 1100. This is especially so for the case shown in FIG. 10 when Vin is between 0.9 and 1.6 volts.

Figure 12:
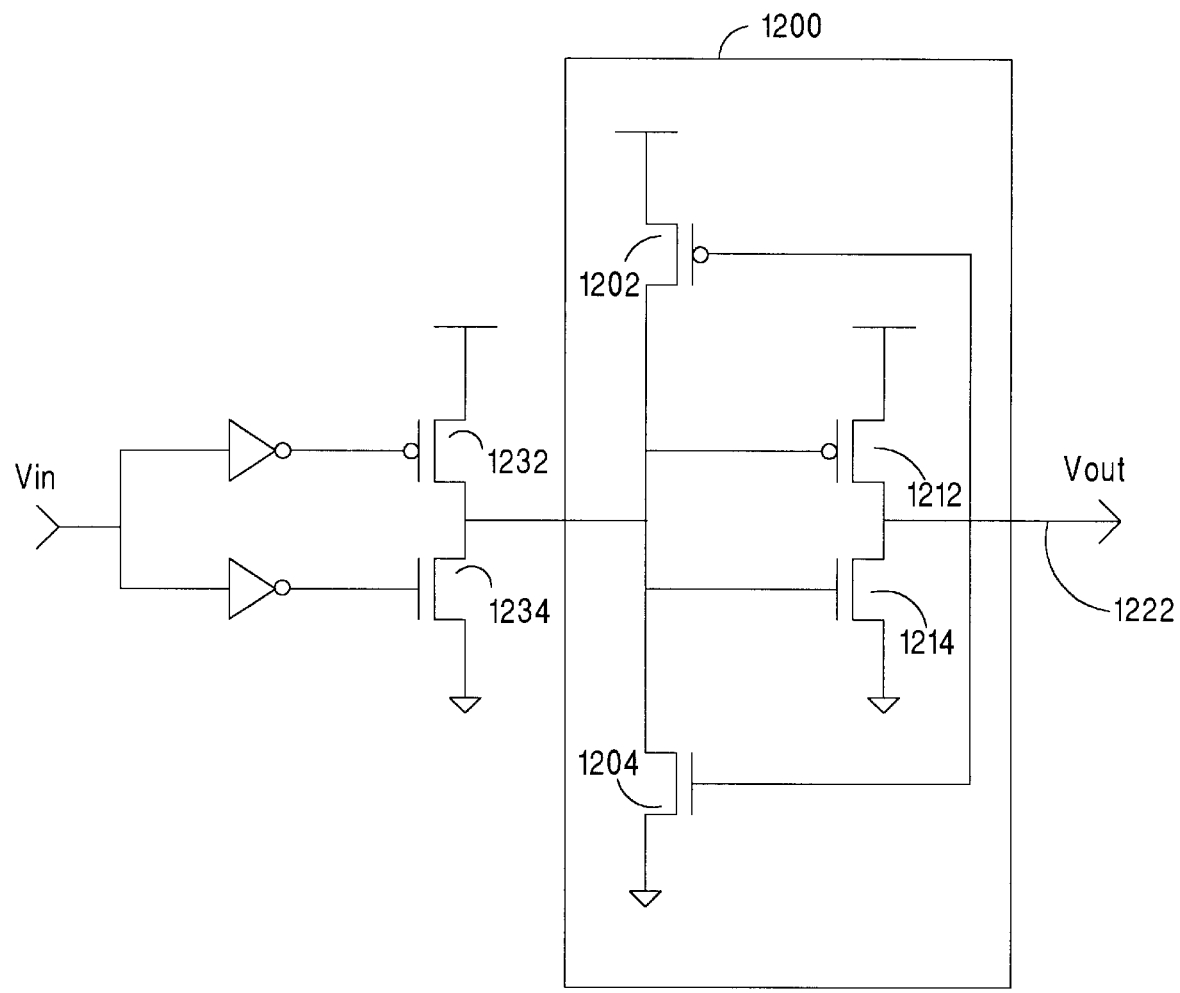
FIG. 12 shows the addition of a strong latch connected in line with the output of the circuit shown in FIG. 4(a) in accordance with the present invention.

A further circuit enhancement to the circuit of FIG. 4(a), which can provides a stronger latch, is shown in FIG. 12. It is noted that the transistors in the latch of FIG. 11 are purposefully made weak relative to the output drive transistors. This is required for the latch to perform a state maintenance function, rather than a state control function. The state control function must be performed by the output driver transistors. FIG. 12 shows the addition of a strong latch 1200 connected in-line with the output of circuit 400 shown in FIG. 4(a). In the embodiment shown, the strong latch 1200 comprises an output driver PFET-NFET pair 1212, 1214, and of a weak feedback PFET-NFET pair 1202, 1204. Proper circuit operation requires that the feedback complementary pair of transistors 1202 1204 be weak transistors relative to the control transistors 1232, 1234. This is so that the control transistors 1232 1234 control the state of the circuit output, Vout 1222. The feedback transistors 1202, 1204 function only to sustain that state. This circuit configuration forces the output, Vout 1222, to be driven by active transistors rather than being allowed to float. With this configuration, the output pair of complementary transistors maintains and presents a low impedance output when the driver output is at a low, at a high, and in transition from the low to the high, and in transition from the high to the low.

Figure 13:
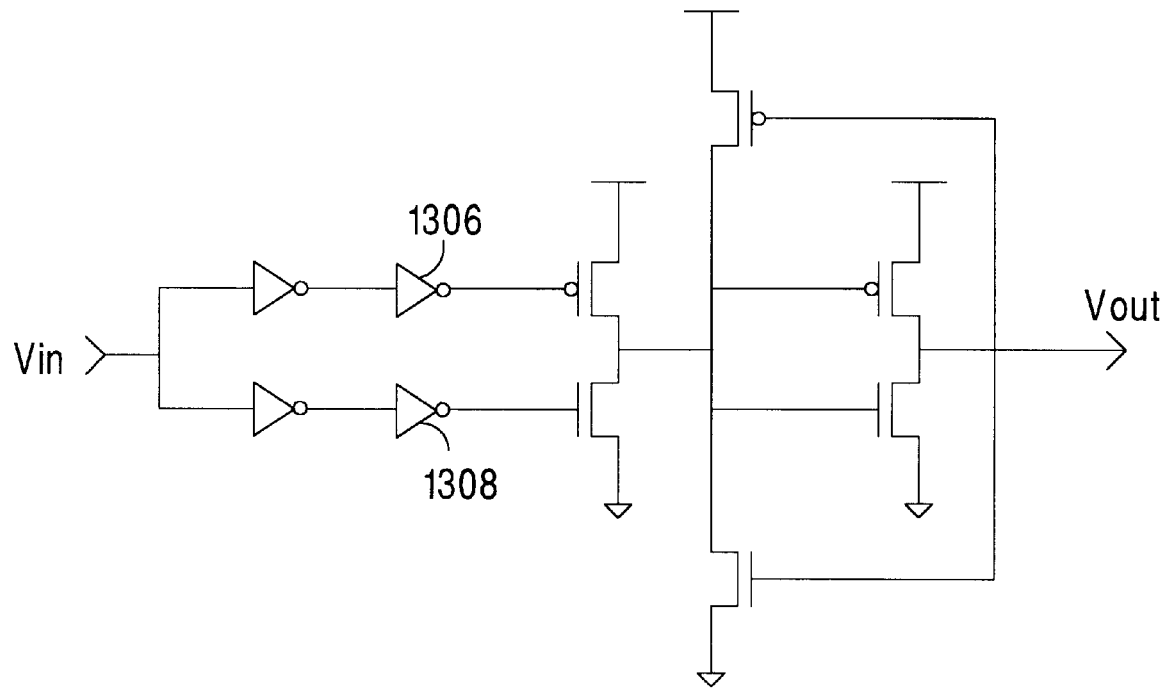
FIG. 13 shows the addition of a second upper inverter and a second lower inverter to the circuit of FIG. 12 in accordance with the present invention.

The circuit of FIG. 12 causes the output Vout 1222 of the receiving gate to be inverted with respect to the input Vin 421. In situations where the inversion is not desirable, the circuit of FIG. 12 can be modified to the circuit of FIG. 13. FIG. 13 shows the addition of a second upper inverter 1306 and a second lower inverter 1308. Besides providing an additional inversion to return the overall receiving gate to a non-inverting buffering function, these inverters 1306 1308 also allow for better optimization of the receiving gates transition transfer curve. It is often advantageous to make the second upper inverter 1306 to have a low threshold, and the second lower inverter 1308 to have a high threshold. This results in a further improvement in both the noise margins, NML and NMH, of the entire circuit.

Figure 14:
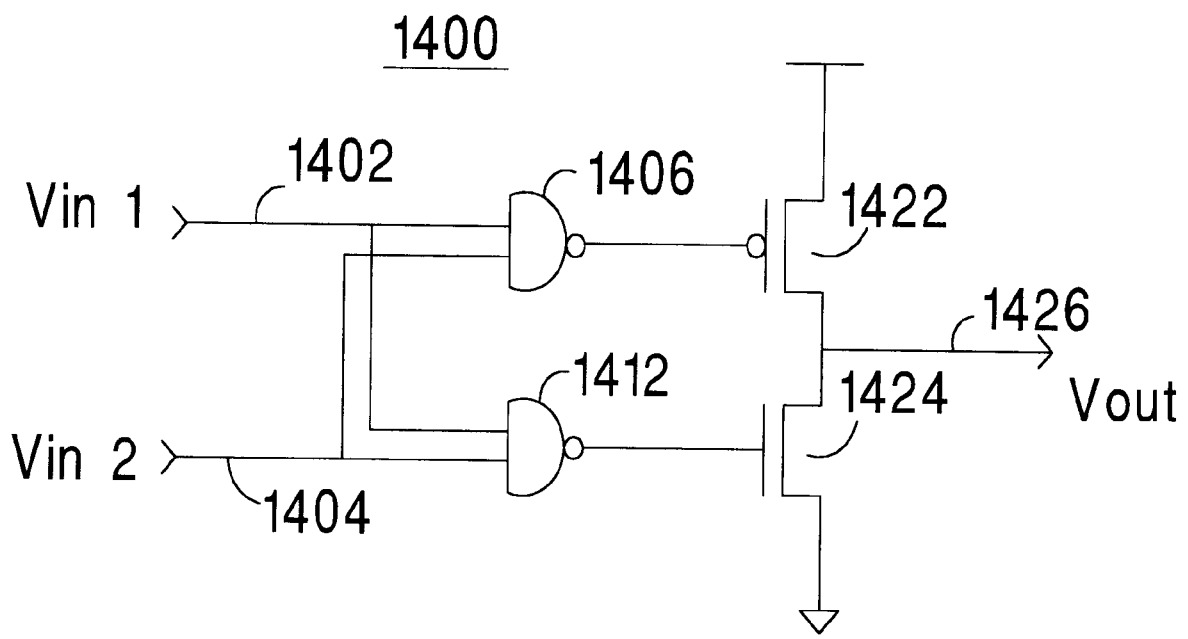
FIG. 14 shows an NAND gate implementation in accordance with the present invention.
Figure 15:
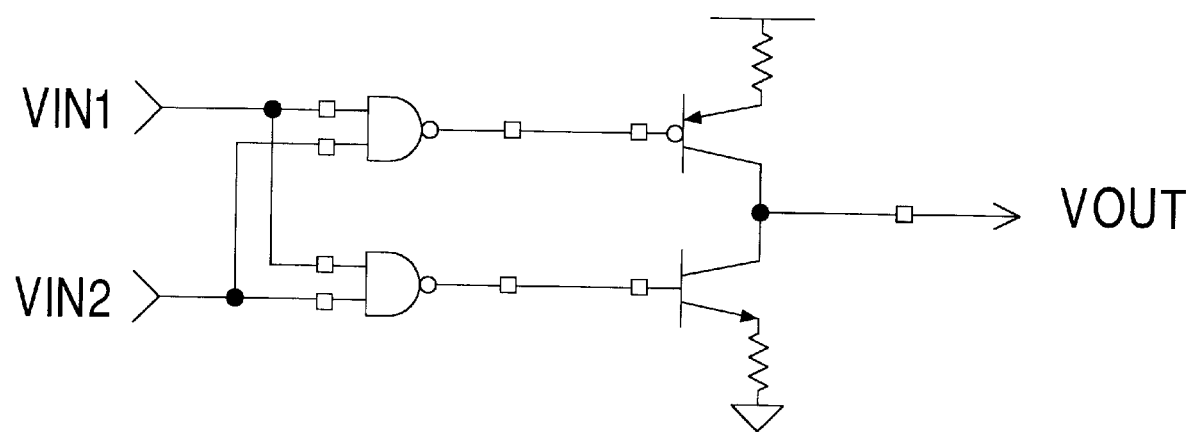
FIG. 15 shows a bipolar circuit implementation of the circuit of FIG. 14.

It is noted that besides for receiving gate circuits, the present invention can similarly be employed in other logical function circuits. FIG. 14 shows an AND gate implementation in accordance with the present invention. In an embodiment of this case, the lower NAND gate 1412 is designed to have the Vout versus Vin transfer curve of FIG. 8. The upper NAND gate 1406 is designed to have the Vout versus Vin transfer curve of FIG. 9. The AND gate 1400 operates in similar fashion to the receiving gate except that it has two inputs Vin1 1402 and Vin2 1404. Both of the inputs 1402 and 1404 feed the NAND gates 1406 1412. The AND gate has a single output 1426 providing the AND logical function of the two inputs 1402 1404. The overall transfer curve of the AND gate 1400 is the same as that shown in FIG. 10. In this case the Vin axis represents the combinational logic of Vin1 and Vin2. The output 1426 is only at a logical high, '1', when both Vin1 1302 and Vin2 1404 are at logical highs. When the NAND gate uses the same NFET and PFET transistor parameters as the receiving gate, its NML and NMH are the same as that of the receiving gate. FIG. 15 shows a bipolar circuit implementation of the circuit of FIG. 14.

Although the description is made for a particular arrangement and components, the intent and concept of the present invention are suitable and applicable to other semiconductor circuit technologies and arrangements. For example, when using bipolar transistors, the threshold and noise margins can be set by using proper biasing techniques to provide the advantages of this invention. Also, even though the circuits and descriptions mostly employ inverter sub-circuits, the invention may clearly be implemented using non-inverting sub-circuit components, and/or mixed circuit configurations. It will be apparent to those skilled in the art that other modifications to the disclosed embodiments can be effected without departing from the spirit and scope of the invention.

What is claimed is:

1. A digital circuit having a plurality of circuit inputs for accepting a plurality of logical signals, said circuit comprising:

a first logic gate forming a multi-input logic function and having a low input threshold, a first gate output, and a plurality of first gate inputs coupled to said circuit inputs;

a second logic gate forming the multi-input logic function, and having a high input threshold, a second gate output, and a plurality of second gate inputs coupled to said circuit inputs, said first and second logic gates being schematically identical and each having a delay of a single gate; and a driver having a first driver input, a second driver input and a driver output, said first driver input being directly coupled to said first gate output, said second driver input being directly coupled to said second gate output.

2. A digital circuit as recited in claim 1, wherein:

said first logic gate is comprised of a first pair of complementary transistors forming a first NAND gate;

said second logic gate is comprised of a second pair of complementary transistors forming a second NAND gate; and, said driver is comprised of a third pair of complementary transistors connected between a pair of power rails so as to commonly form said circuit output.

3. A digital circuit as recited in claim 2, wherein:
said third pair of complementary transistors includes a PFET and an NFET;
said first driver input is an input of said NFET; and
said second driver input is an input of said PFET.

4. A digital circuit as recited in claim 1, further comprising a latch circuit having a latch input and a latch output coupled to said driver output for maintaining current flow in said driver.

5. A digital circuit as recited in claim 4, wherein:
said driver is comprised of a first pair of complementary transistors;
said latch circuit comprises:
a second pair of complementary transistors having a first common input forming said latch input, and a first common output; and
a third pair of complementary transistor having a second common input coupled to said first common output, a second common output forming said latch output, wherein said third pair of complementary transistors is weaker than said first pair of complementary transistors.

6. A digital circuit as recited in claim 2, wherein said driver is comprised of a first pair of complementary transistors, and said digital circuit further includes a current buffer coupled in-line with said driver output and comprising:
a second pair of complementary transistors forming an inverter having a first common input coupled to said driver output, and a first common output; and
a third pair of complementary transistors having a second common input coupled to said first common output, and a second common output coupled to said first common input to provide feedback, wherein said third pair of complementary transistors is weaker than said first pair of complementary transistors.

7. A digital circuit as recited in claim 6, wherein said second pair of complementary transistors present a low impedance output when said driver output is at a low, at a high, and in transition from said low to said high, and in transition from said high to said low.

8. A digital circuit as recited in claim 1, wherein said circuit is comprised of bipolar transistors.

9. A digital circuit having a plurality of circuit inputs for accepting a plurality of logical signals, said circuit comprising:
a first logic gate forming a multi-input logic function and, having a low input threshold, a first gate output, and a plurality of first gate inputs coupled to said circuit inputs;
a second logic gate forming the multi-input logic function, and having a high input threshold, a second gate output, and a plurality of second gate inputs coupled to said circuit inputs, said first and second logic gates being schematically identical and having a delay of a single gate;
a third logic gate having a third gate input directly coupled to said first gate output, and a third gate output;
a fourth logic gate having a fourth gate input directly coupled to said second gate output, and a fourth gate output; and
a driver having a first driver input, a second driver input and a driver output, wherein said first driver input is directly coupled to said third gate output, and said second driver input is directly coupled to said fourth gate output.

10. A digital circuit as recited in claim 9, wherein said driver is comprised of a complementary pair of transistors connected between a pair of power rails so as to commonly form said driver output, said digital circuit further includes a current buffer comprised of a complementary pair of strong transistors at least one of which is in an active state, and said current buffer is coupled in-line with said driver output.

11. A digital circuit comprising:
a plurality of circuit inputs for accepting a plurality of logical signals, and having a circuit output;
a first multi-input gate forming a multi-input logic function, and having a plurality of first gate inputs directly coupled to said circuit inputs, a first gate output, and a high 'noise-margin-high';
a second multi-input gate forming a multi-input logic function, and having a plurality of second gate inputs directly coupled to said circuit inputs, a second gate output, and a high 'noise-margin-low', said first and second multi-input gates being schematically identical and each having a delay of a single gate; and
a dual input inverter gate having a third gate input directly coupled to said first gate output, a fourth gate input directly coupled to said second gate output, and an inverter output which forms said circuit output.

12. A method to increase a noise margin of a digital circuit having a plurality of circuit inputs for accepting a plurality of logical signals, said method comprising:
providing a first logic gate forming a multi-input logic function, and having a low input threshold, and having a plurality of first gate inputs and a first gate output;
directly coupling said first gate inputs to said circuit inputs;
providing a second logic gate forming the multi-input logic function, and having a high input threshold, and having a plurality of second gate inputs and a second gate output, said first and second logic gates being schematically identical and each having a delay of a single gate;
directly coupling said second gate inputs to said circuit inputs;
providing a driver having a first driver input, and a second driver input;
directly coupling said first driver input to said first gate output; and
directly coupling said second driver input to said second gate output.

13. A method as recited in claim 12, further comprising the steps of forming said first logic gate into a first NAND gate having a number of inputs, and forming said second logic gate into a second NAND gate having the same number of inputs.

14. A method as recited in claim 12, further comprising the step of forming a common driver output for said driver using a first pair of complementary transistors connected between a pair of power rails.

15. A method as recited in claim 14 wherein said first pair of complementary transistors includes a PFET and an NFET, said first driver input is an input of said NFET, and said second driver input is an input of said PFET.

16. A method as recited in claim 12, further comprising the steps of:
providing a latch circuit having a latch input and a latch output, and
coupling both said latch input and said latch output to said driver output for maintaining current flow in said driver.

17. A method as recited in claim 16, including the steps of:
    forming said driver from a first pair of complementary transistors;
    forming said latch circuit from a second pair of complementary transistors having a first common input forming said latch input, a first common output, and from a third pair of complementary transistor having a second common input coupled to said first common output, and a second common output forming said latch output; and
    forming said third pair of complementary transistors to be weaker than said first pair of complementary transistors.

18. A method as recited in claim 12, further comprising the step of providing a current buffer comprised of a complementary pair of strong transistors, wherein at least one of said complementary pair of strong transistors is in an active state, and coupling said current buffer in-line with said driver output.

19. A method as recited in claim 18, including the step of forming said complementary pair of strong transistors to present a low impedance output when said driver output is at a low, at a high, in transition from said low to said high, and in transition from said high to said low.

20. A method as recited in claim 12, wherein said circuit is comprised of bipolar transistors.

21. A method for increasing a noise margin of a digital circuit having a plurality of circuit inputs for accepting a plurality of logical signals, said method comprising:
    providing a first logic gate forming a multi-input logical function, and having a low input threshold, a first gate inputs, and a first gate output;
    directly coupling said first gate inputs to said circuit inputs;
    providing a second logic gate forming the multi-input logical function and having a high input threshold, a plurality of second gate inputs, and a second gate output, said first and second logic gates being schematically identical and each having a delay of a single grate;
    directly coupling said second gate inputs to said circuit inputs;
    providing a third logic gate having a third gate input and a third gate output;
    directly coupling said third gate input to said first gate output;
    providing a fourth logic gate having a fourth gate input and a fourth gate output;
    directly coupling said fourth gate input to said second gate output;
    providing a driver having a first driver input, a second driver input, and a driver output;
    directly coupling said first driver input to said third gate output, and said second driver input to said fourth gate output; and
    forming said driver of a complementary pair of transistors connected between a pair of power rails so as to commonly form said driver output.

22. A method as recited in claim 21 further comprising the steps of providing a current buffer comprised of a complementary pair of strong transistors at least one of which is in an active state, and coupling said current buffer in-line with said driver output.

23. A method as recited in claim 21 further comprising the steps of forming said third logic gate to have a high input threshold, and forming said fourth logic gate to have a low input threshold.

24. A method for separately setting a first noise margin of a multi-input digital circuit for input transitions from a low to a high, and a second noise margin for input transitions from a high to a low, said method comprising:
    providing a plurality of circuit inputs for accepting a plurality of logical signals and having a circuit output;
    providing a first gate forming a multi-input logic function, and having a plurality of first gate inputs, a first gate output and a low threshold forming a high 'noise-margin-high';
    directly coupling said first gate inputs to said circuit inputs;
    providing a second gate forming the multi-input logic function and having a plurality of second gate inputs a second gate output and a high 'noise-margin-low', said first and second logic rates being schematically identical and each having a delay of a single gate;
    directly coupling said second gate inputs to said circuit inputs;
    providing a two input inverter gate having a third gate input, a fourth gate input, and forming said circuit output; and
    directly coupling said third gate input to said first gate output, and said fourth gate input to said second gate output.

* * * * *